United States Patent [19]
Ahlburn et al.

[11] Patent Number: 5,607,773
[45] Date of Patent: Mar. 4, 1997

[54] METHOD OF FORMING A MULTILEVEL DIELECTRIC

[75] Inventors: Byron T. Ahlburn, Plano; Thomas R. Seha, Dallas, both of Tex.

[73] Assignee: Texas Instruments Incorporated, Dallas, Tex.

[21] Appl. No.: 359,784

[22] Filed: Dec. 20, 1994

[51] Int. Cl.$^6$ .................................................. B32B 9/00
[52] U.S. Cl. .................. 428/427; 427/255.6; 427/255.7; 427/294; 427/404; 427/579; 428/428; 428/448; 428/469; 428/901
[58] Field of Search ................................ 427/579, 294, 427/255.7, 255.6, 404; 428/427, 428, 448, 469, 901

[56] References Cited

U.S. PATENT DOCUMENTS 4,756,977  7/1988  Haluska et al. ...................... 428/704

*Primary Examiner*—Bernard Pianalto
*Attorney, Agent, or Firm*—Robby Holland; Leo Heiting; Richard Donaldson

[57] ABSTRACT

A method of forming a planar dielectric layer over an interconnect pattern which requires fewer processing steps and has a lower dielectric constant than is obtained in the prior art. The method comprises providing a substrate having an electrical interconnect pattern thereon, forming a first layer of dielectric over the interconnect pattern, preferably by plasma generated TEOS oxide, forming a porous second layer of silicon-containing dielectric with low dielectric constant different from the first layer over the first dielectric layer from an inorganic silicon-containing composition, preferably hydrogen silsesquioxane and forming a third layer of dielectric different from the second layer over the second dielectric layer, preferably by a plasma generated TEOS oxide. The step of forming the second layer comprises the steps of depositing an inorganic silicon-containing composition capable of being pyrolytically converted to a silicon oxide over the first layer and placing the resulting structure in an essentially pure nitrogen and essentially moisture-free environment at a pressure at or below atmospheric pressure and then heating the silicon-containing composition to a temperature of from about 375° C. to about 425° C. and preferably 400° C. for from about 30 minutes to about 90 minutes to convert the silicon-containing composition to silicon oxide.

21 Claims, 3 Drawing Sheets

W LEADS

PECVD OXIDE

SOG COAT AND CURE

SOG ETCHBACK

POLYMER REMOVAL $H_2O$ SCRUB

PECVD

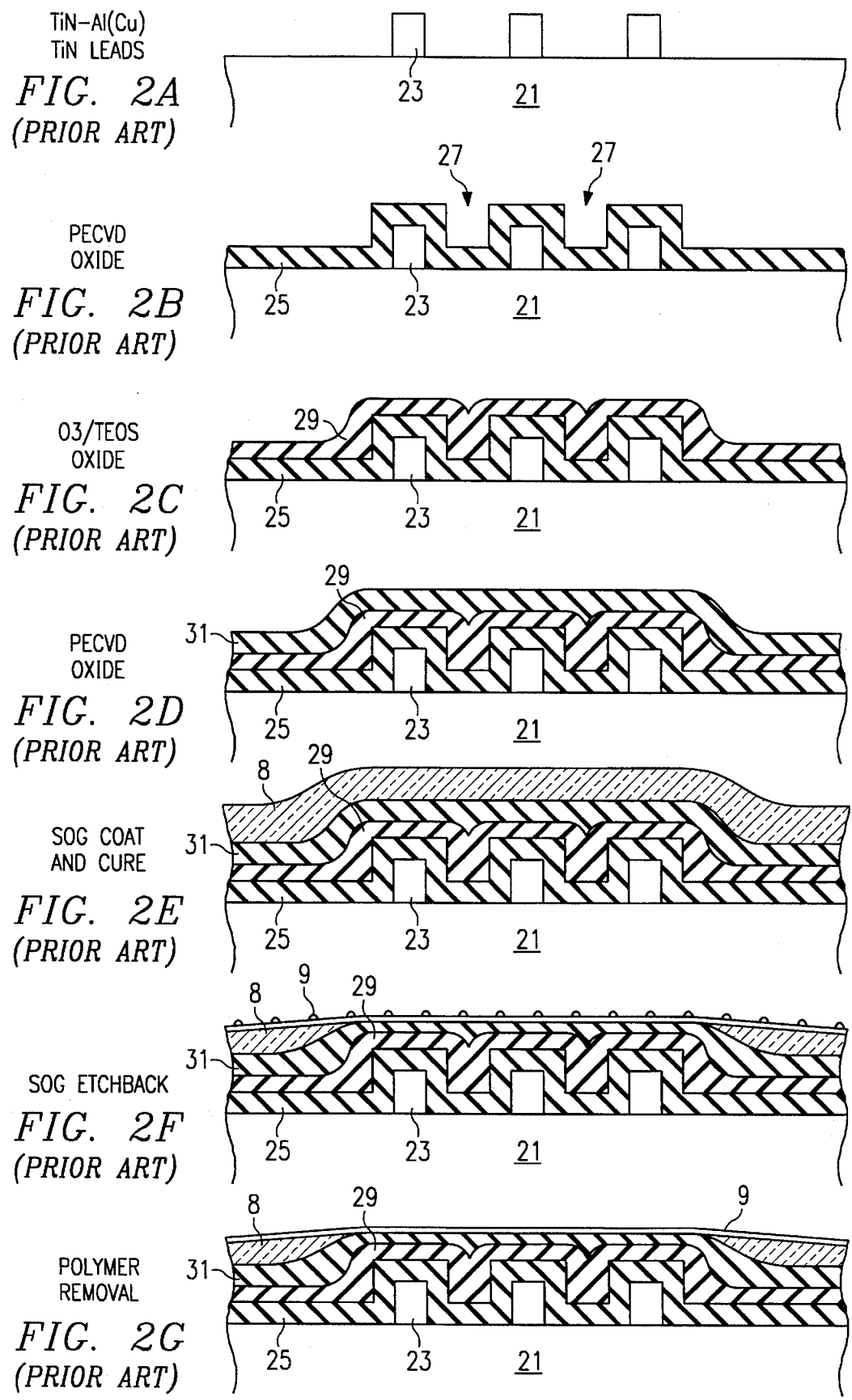

METHOD OF FORMING A MULTILEVEL DIELECTRIC

BACKGROUND OF THE INVENTION

1. Field of the Invention

This invention relates to a method of forming a planar dielectric layer over an interconnect pattern and the completed structure.

2. Brief Description of the Prior Art

As geometries in semiconductor circuits have shrunk to and below 0.5 microns, demands upon the inter level dielectric (ILD) films for the interconnect patterns in the semiconductor circuits have become increasingly stringent. ILD films must fill gaps with higher aspect ratios and provide lower dielectric constants than are required of the ILD films currently in use. Reduction of dielectric constant reduces both inter-level and intra-level capacitance, both of which slow down the operation of circuits processed with oxides presently used for electrical isolation. It is well known that this slowing down effect becomes progressively more severe as the circuit complexity increases.

The prior art has utilized spin on glass (SOG) to fill gaps and planarize part or all of the surfaces of chips or wafers so that second and any subsequent levels of metal in a multilevel interconnect system could be exposed, developed and etched without narrowing of the leads or occurrence of certain other known problems. The SOG used in the prior art has been organic in nature, generally methylsiloxane or the like. With smaller geometries, when the organic SOG is exposed while in vias, it has outgassed moisture or other substances that caused high resistances to be encountered in the vias when electrically conductive metals were sputtered into the vias. This problem is known as via poisoning and arises when methylsiloxane-based spun on glass is used for gap fill and planarization of integrated circuits with multiple levels of metal interconnect. The quality of chemical vapor deposited (CVD) tungsten deposition in vias which have such organic SOG exposed in the via sidewalls is severely compromised, often resulting in incompletely filled vias, vias with high resistance and metal growth (hillocks) from the tops of vias that cause short circuits with other metal lines. It is believed that the organic portion of the organic SOG reacts in some adverse way with the tungsten source materials.

The standard solution to the problem of via poisoning is to perform a partial plasma etch back of the SOG, leaving the SOG only between or along the sides of metal leads. This solution requires that semi-organic glass be deposited over the entire wafer with etch back in a plasma etcher. This procedure is very slow, very dirty, leaves particles on the wafer and is not uniform. Other approaches use thinner coats of SOG, such as by moving the vias to locations where the SOG layer is thinner or in conjunction with careful cure, etch, via bake and metal deposition procedures, with varying degrees of success.

At present, there is no known production-worthy solution to the problem of high parasitic capacitance associated with decreased metal lead spacings. Approaches that have been under study include high density plasma deposition of fluorinated oxides, CVD parylene and an assortment of other spin on materials which require special processing.

SUMMARY OF THE INVENTION

In accordance with the present invention, the steps and equipment related to the plasma etch back of SOG are eliminated, resulting in cycle time improvement and cost reduction. Planarization improves with increasing SOG thickness and decreasing oxide thickness under the SOG. In addition, the process complexity required for the deposited oxide layers used with the SOG decreases significantly.

Briefly, the approach presented herein uses a single thick layer of an inorganic SOG and leaves all of the inorganic SOG on the wafer. No special treatment is required at cure, etch or during the metal deposition steps. The inorganic source of silicon oxide, which is preferably hydrogen silsesquioxane (HSQ), has the chemical formula $(HSiO_{3/2})_n$ and is also known as Dow Corning Corporation's 9-5115 dielectric material, is used in place of the organic methylsiloxane in the spin on glass. This material is used in conjunction with a carefully designed but simple set of process steps which enable both the simplified manufacturing process and the lower dielectric constant. The dielectric constant of an HSQ film is believed to be linked to the SiH and —OH bonds in the film and has a lower dielectric constant than plasma TEOS oxide or ozone TEOS oxide, the interlevel dielectric materials currently in use. Also, the density and porosity of the dielectric film affect the dielectric constant through absorption or desorption of water. In accordance with the present invention, a dielectric constant less than 4.0 is desired for the inorganic silicon-containing composition. The dielectric constant of the SOG can be lowered to about 3.0 whereas the materials currently in use have a dielectric constant of about 4.1. Silicate based SOGs can be used without producing via poisoning, but they shrink substantially when subjected to curing processes and experience uncontrollable and unacceptable cracking. There is also recent evidence that some organic SOGs can be cured by combining a thorough oxygen plasma treatment with a subsequent thermal treatment to avoid both via resistance and cracking, but this still requires an additional process step.

The process flow in accordance with the present invention, which can be used for both DRAM and logic circuit fabrication, includes initially forming the interconnect pattern on a substrate as in the prior art with the interconnect pattern being formed from an appropriate metal such as, for example, tungsten, aluminum, copper, etc. A layer of plasma tetraethylorthosilicate (TEOS) oxide having a thickness of from about 3000 Å to about 5000 Å and preferably 4000 Å is then deposited over the exposed surface, leaving indentations or valleys in the region between portions of the interconnect pattern. A coating of HSQ having a thickness of from about 3500 Å to about 7300 Å and preferably 5400 Å is then formed over the TEOS oxide. The structure is then cured by heating to a temperature of from about 375° C. to about 425° C. and preferably 400° C. for from about 30 to about 90 minutes and preferably 45 minutes at a pressure of from about 600 mTorr to about 760 mTorr in an essentially pure nitrogen ambient with essentially no oxygen or moisture therein to convert the HSQ to a silicon oxide with essentially no —OH bonds therein. The lower the water content, the fewer —OH bonds will be present, the dielectric constant being between 4.1 and about 3.0 depending upon the number of —OH bonds present. It appears that the resulting oxide has a structure $SiO_x$, where $1 \leq x \leq 2$. This oxide is relatively impervious to the uptake of moisture even though it may be somewhat less dense than typical $SiO_2$. The dielectric constant of the silicon oxide is about 3.0±about 0.1. Then a layer of TEOS oxide having a thickness of from about 2000 Å to about 4000 Å and preferably 3000 Å is deposited over the HSQ following a bake in nitrogen at a pressure of from about 3 Torr to about 15 Torr and preferably 9 Torr at a temperature of from about 370° C. to about 410° C. and preferably 390° C. in a vacuum chamber to provide the completed interconnect layer with dielectric thereover. Vias can now be etched to the interconnect pattern in standard manner and a further layer of interconnect can then be formed on the dielectric layer with further dielectric thereover by a repeat of the processing procedure discussed above.

It follows that proper choice of time, temperature and gas ambient during cure of the hydrogen silsesquioxane-based SOG results in lower capacitance than possible with presently used interlevel dielectric films with no extra process time or complexity required.

BRIEF DESCRIPTION OF THE DRAWINGS

FIGS. 2A, 2B, 2C, 2D, 2E, 2F, 2G, 2H and 2I are a process flow for a prior art procedure for providing a planarized dielectric layer over an interconnect pattern for a logic circuit.

DESCRIPTION OF THE PREFERRED EMBODIMENT

Figure 1A:
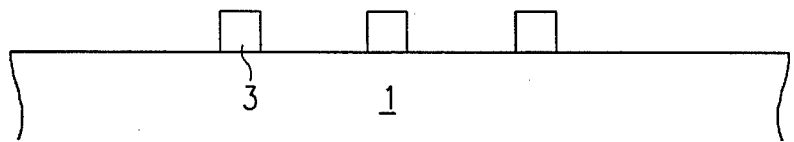
FIGS. 1A, 1B, 1C, 1D, 1E, 1F and 1G are a process flow for a prior art procedure for providing a planarized dielectric layer over an interconnect pattern for a DRAM.
Figure 1B:
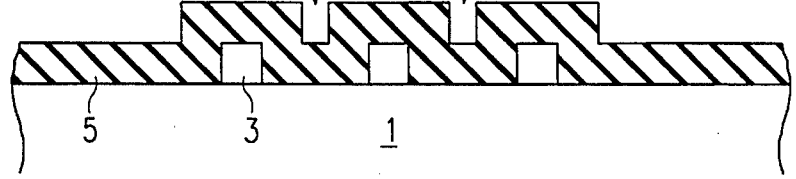
Figure 1C:
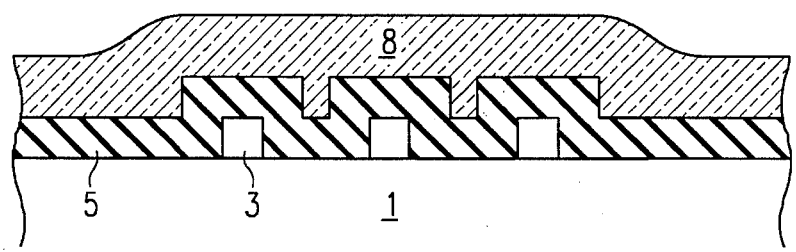
Figure 1D:
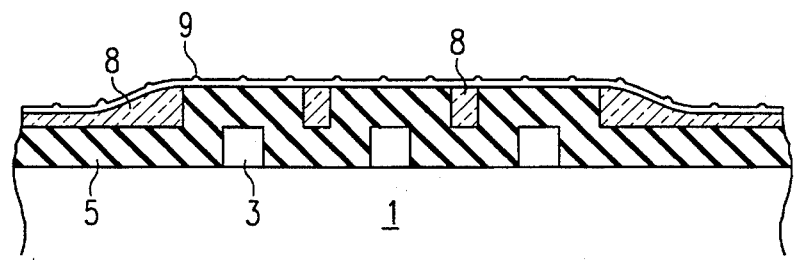
Figure 1E:
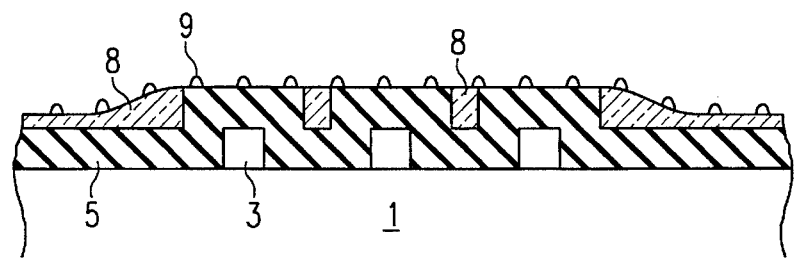
Figure 1F:
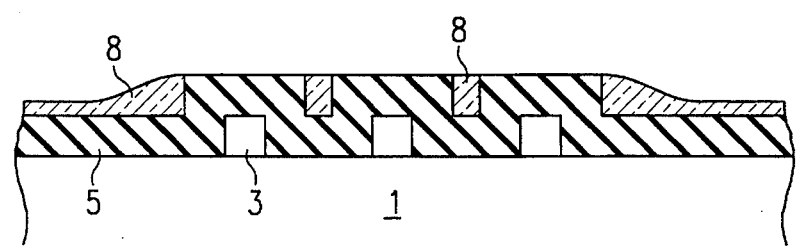
Figure 1G:
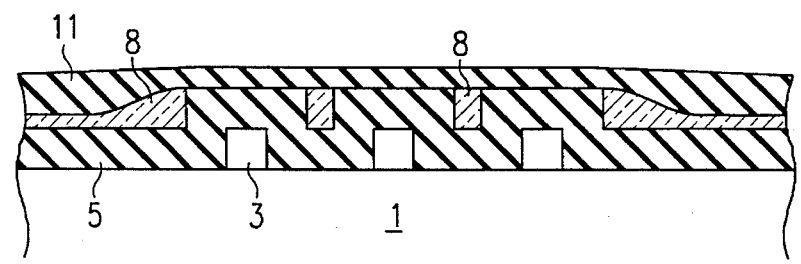

Referring first to FIGS. 1A, 1B, 1C, 1D, 1E, 1F and 1G, there is shown a process flow for a prior art procedure for providing a planarized dielectric layer over an interconnect pattern for a DRAM. Initially, the interconnect pattern 3 is formed on a substrate 1 by deposition of the interconnect metal, such as tungsten, with subsequent patterning and etching as shown in FIG. 1A. A 7000 Å layer of plasma TEOS oxide 5 is then deposited over the exposed surface, leaving indentations or valleys 7 in the region between portions of the interconnect pattern as shown in FIG. 1B. A 6200 to 6400 Å layer of organic SOG 8 is then deposited over the structure of FIG. 1B and cured as shown in FIG. 1C or etched back and then cured. The structure of FIG. 1C is then etched back if not previously etched back to until the TEOS oxide 5 is exposed as shown in FIG. 1D and then any polymers 9 collected on the structure are removed by an oxygen plasma treatment as shown in FIG. 1E. Any remaining polymer and dirt is then removed from the surface with a water scrub as shown in FIG. 1F. The structure is then baked at a temperature of 410° C. for about 2½ minutes and a 5000 Å layer of TEOS oxide 11 is then deposited over the surface as shown in FIG. 1G to provide the planarized surface.

Figure 2H:
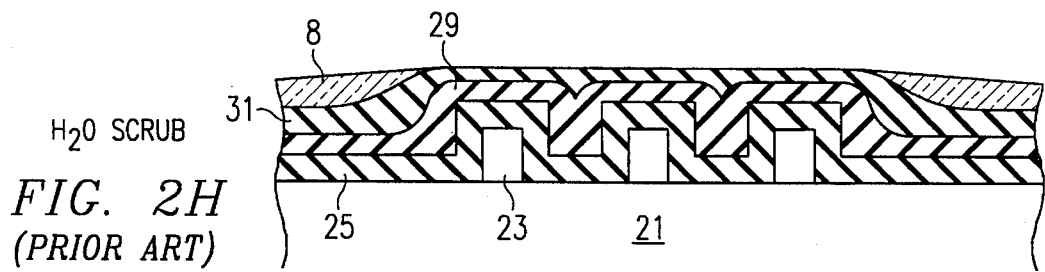
Figure 2I:
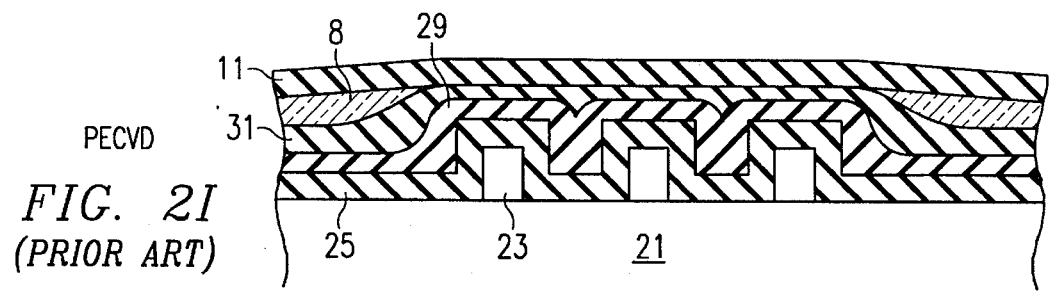

Referring now to FIGS. 2A, 2B, 2C, 2D, 2E, 2F, 2G, 2H and 2I there is shown the process flow for a prior art procedure for providing a planarized dielectric layer over an interconnect pattern for a logic circuit. Initially, the interconnect pattern 23 is formed on a substrate 21 by deposition of the interconnect metal, such as aluminum, with subsequent patterning and etching as shown in FIG. 2A. Since aluminum can form hillocks which can cause short circuits with overlying interconnect layers, it is necessary to provide a thicker dielectric layer than is required in the DRAM embodiment. Therefore, a 3000 Å layer of plasma TEOS oxide 25 is deposited over the exposed surface, leaving indentations or valleys 27 in the region between portions of the interconnect pattern as shown in FIG. 2B. This is followed by a nitrogen plasma treatment which is then followed by a 3000 Å layer of ozone TEOS oxide 29 as shown in FIG. 2C and then by a 4000 Å layer of plasma TEOS oxide 31 as shown in FIG. 2D. The procedure is then the same as explained hereinabove for the DRAM with reference to FIGS. 1C, 1D, 1E, 1F and 1G which correspond to FIGS. 2E, 2F, 2G, 2H and 2I, respectively.

Figure 3A:
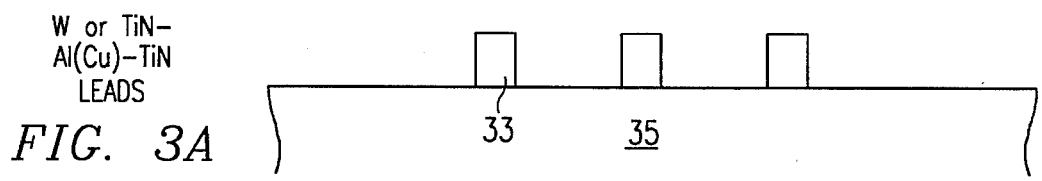
FIGS. 3A, 3B, 3C and 3D are a process flow in accordance with the present invention which can be used for both DRAM and logic circuit fabrication.
Figure 3B:
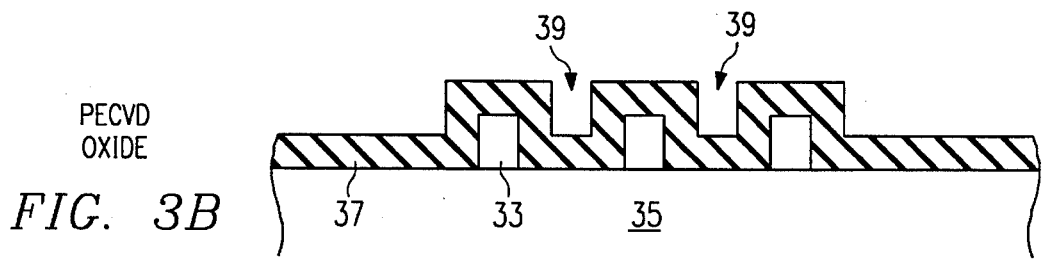
Figure 3C:
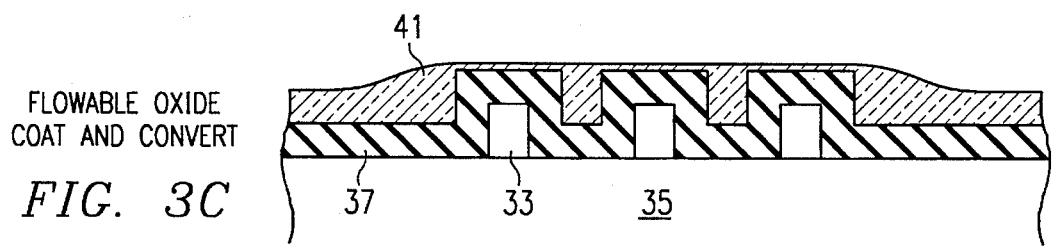
Figure 3D:
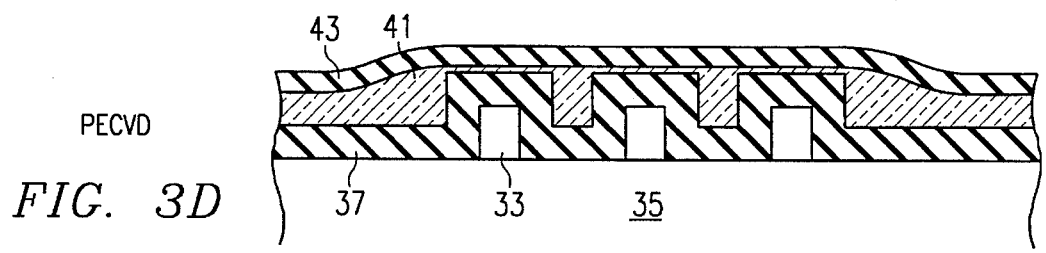

Referring now to FIGS. 3A, 3B, 3C and 3D is shown a process flow in accordance with the present invention which can be used for both DRAM and logic circuit fabrication. Initially, the interconnect pattern 33 is formed on a substrate 35 as in the prior art with the interconnect pattern being formed from an appropriate metal such as, for example, tungsten, aluminum, copper, etc. as shown in FIG. 3A. A 4000 Å layer of plasma TEOS oxide 37 is then deposited over the exposed surface, leaving indentations or valleys 39 in the region between portions of the interconnect pattern as shown in FIG. 3B. A 5400 Å coating of HSQ 41 is then formed over the TEOS oxide 37 as shown in FIG. 3C. The structure of FIG. 3C is then cured and a 3000 Å layer of TEOS oxide 43 is then deposited over the HSQ as shown in FIG. 3D to provide the completed interconnect layer with dielectric thereover. Vias can now be etched to the interconnect pattern 33 in standard manner and a further layer of interconnect can then be formed on the layer 43 with further dielectric thereover by a repeat of the processing procedure discussed above with reference to FIGS. 3A, 3B, 3C and 3D.

It can be seen that there is provided a metal interconnect layer with dielectric thereover which is planar, overcomes the problems inherent in the prior art as explained above, and which requires significantly fewer processing steps than are required in accordance with prior art procedures.

As a further embodiment, the layers 37 and 43 can be fluorine doped during deposition to lower the dielectric constant of these layers. This can be accomplished by adding a standard dopant containing a fluorine species while forming the layers 37 and/or 43. A typical material containing fluorine that can be used is carbon tetrafluoride ($CF_4$) along with, for example, TEOS and oxygen to form a fluorine containing silicon oxide.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

We claim:

1. A method of forming a planar dielectric layer over an interconnect pattern comprising the steps of:

(a) providing a substrate having an electrical interconnect pattern thereon;

(b) forming a first layer of dielectric over said interconnect pattern;

(c) forming a second layer of silicon-containing dielectric different from said first layer over said first dielectric layer from an inorganic silicon-containing composition; and (d) forming a third layer of dielectric different from said second layer over said second dielectric layer.

2. The method of claim 1 wherein said first layer is a plasma generated TEOS oxide.

3. The method of claim 2 wherein said silicon-containing composition is HSQ.

4. The method of claim 3 wherein said third layer is a plasma generated TEOS oxide.

5. The method of claim 2 wherein said third layer is a plasma generated TEOS oxide.

6. The method of claim 1 wherein said silicon-containing composition is HSQ.

7. The method of claim 6 wherein said third layer is a plasma generated TEOS oxide.

8. The method of claim 1 wherein said third layer is a plasma generated TEOS oxide.

9. The method of claim 1 wherein the step of forming said second layer comprises the steps of depositing an inorganic silicon-containing composition capable of being pyrolytically converted to a silicon oxide over the structure from step (b) and placing the resulting structure in an essentially pure nitrogen and essentially moisture-free environment at a pressure at or below atmospheric pressure, then heating the said silicon containing composition to a temperature of from about 375° C. to about 425° C. for from about 30 minutes to about 90 minutes to convert said silicon-containing composition to silicon oxide.

10. The method of claim 9 wherein said silicon-containing composition is HSQ.

11. The method of claim 10 wherein said temperature is about 400° C. for about 45 minutes.

12. The method of claim 9 wherein said temperature is about 400° C. for about 45 minutes.

13. The method of claim 1 wherein the step of forming the said third layer comprises the steps of placing the structure from step (c) in a vacuum chamber and heating in a nitrogen ambient at a pressure of from about 3 Torr to about 15 Torr at a temperature of from about 350° C. to about 430° C. for from about 30 seconds to about 90 seconds and then depositing a layer of plasma generated TEOS oxide with a thickness of from about 2000 Å to about 4000 Å over said structure.

14. The method of claim 13 wherein said temperature is about 390° C. for about 60 seconds.

15. The method of claim 13 wherein said pressure is about 9 Torr.

16. The method of claim 13 wherein the said thickness is about 3000 Å.

17. A multilevel interconnect pattern comprising:

(a) a substrate having an electrical interconnect pattern thereon;

(b) a first layer of dielectric over said interconnect pattern;

(c) a second layer of silicon-containing dielectric different from said first layer over said first dielectric layer formed from an inorganic silicon-containing composition capable of forming silicon oxide;

(d) a third layer of dielectric different from said second layer over said second dielectric layer; and (e) an electrical interconnect pattern disposed over said third layer.

18. The pattern of claim 17 wherein said silicon-containing composition is HSQ.

19. The pattern of claim 18 wherein said second layer has a dielectric constant less than 4.0.

20. The pattern of claim 17 wherein said second layer has a dielectric constant less than 4.0.

21. A method of forming a multilevel dielectric on an integrated circuit, comprising the steps of:

forming a first dielectric on a semiconductor wafer;

forming a second dielectric of hydrogen silsesquioxane-based spin-on-glass on the first dielectric without etching the hydrogen silsesquioxane spin-on-glass; and forming a third dielectric on the second dielectric.

* * * * *